United States Patent [19]

Tseng

[11] Patent Number: 5,677,223
[45] Date of Patent: Oct. 14, 1997

[54] METHOD FOR MANUFACTURING A DRAM WITH REDUCED CELL AREA

[75] Inventor: Horng-Huei Tseng, Hsinchu, Taiwan

[73] Assignee: Vanguard International Semiconductor Corporation, Hsinchu, Taiwan

[21] Appl. No.: 726,913

[22] Filed: Oct. 7, 1996

[51] Int. Cl.[6] .................................... H01L 21/8242
[52] U.S. Cl. ............................ 437/52; 437/60; 437/919
[58] Field of Search ........................ 437/47, 60, 52, 437/919

[56] References Cited

U.S. PATENT DOCUMENTS

| | | |
|---|---|---|
| 5,021,357 | 6/1991 | Taguchi et al. . |
| 5,302,540 | 4/1994 | Ko et al. . |
| 5,374,580 | 12/1994 | Baglee et al. . |
| 5,399,518 | 3/1995 | Sim et al. ........................ 437/52 |
| 5,403,766 | 4/1995 | Miyake ........................... 437/52 |
| 5,585,303 | 12/1996 | Hong et al. ...................... 437/52 |

Primary Examiner—Jey Tsai
Attorney, Agent, or Firm—Christensen, O'Connor, Johnson & Kindness, P.L.L.C.

[57] ABSTRACT

The present invention relates to a method of forming a capacitor on a semiconductor substrate. A first dielectric layer is formed on a semiconductor substrate. A contact hole is created in the first dielectric layer. A polysilicon layer is formed on the first dielectric layer and in the contact hole. Subsequently, a second dielectric layer is formed on the first polysilicon layer. A photoresist is patterned on the second dielectric layer. A oxygen plasma etching is used to narrow the photoresist. A etching is performed by using the narrowed photoresist as a mash to etch the second dielectric layer. The narrowed photoresist is then stripped to formed a insulator pillar. A second polysilicon layer is deposited on the first polysilicon layer and on the pillar. An etching process is used to etch the second polysilicon layer to form sidewall spacers on the sidewall of the pillar. The pillar is then removed by HF vapor. A dielectric film is coated along the surface of the first polysilicon layer and the sidewall spacers. A third polysilicon layer is then formed on the dielectric film.

28 Claims, 5 Drawing Sheets

METHOD FOR MANUFACTURING A DRAM WITH REDUCED CELL AREA

FIELD OF THE INVENTION

The present invention relates to methods of fabricating a semiconductor device, and more specifically, to methods of forming a Dynamic Random Access Memory (DRAM) cell. Still more particularly, the present invention relates to methods of forming a DRAM cell capacitor to reduce cell area and achieve high capacitance.

BACKGROUND

Semiconductor DRAM devices have many memory cells. Indeed, a memory cell is provided for each bit stored by a DRAM device. Each memory cell typically consists of a storage capacitor and an access transistor. Either the source or drain of the access transistor is connected to one terminal of the capacitor. The other side of the transistor's channel and the transistor gate electrode are connected to external connection lines called a bit line and a word line, respectively. The other terminal of the capacitor is connected to a reference voltage. The formation of a DRAM memory cell includes the formation of a transistor, a capacitor and contacts to external circuits. The capacitor type that has been typically used in DRAM memory cells are planar capacitors, because they are relatively simple to manufacture.

It has been the trend in integrated circuit technology to increase the density of semiconductor devices per unit area of silicon wafer. However, this reduction in size can cause performance problems, especially for DRAM memory cells that use planar capacitors. In particular, in order to achieve high performance (e.g., high density) DRAM devices, the memory cells must be scaled down in size to the submicrometer range. This causes reduction in capacitor area, resulting in the reduction of cell capacitance. In this case, because the area of the charge storage capacitor is also decreased, the capacitance becomes relatively small. This decrease in storage capacitance leads to lowered signal-to-noise ratios and increased errors due to alpha particle interference.

Accordingly, for very small memory cells, planar capacitors become very difficult to use reliably. Additionally, as the capacitance decreases, the charge held by storage capacitor must be refreshed often. A simple stacked planar capacitor generally cannot provide sufficient capacitance for good performance, even with high performance dielectrics, such as $Ta_2O_5$.

Prior art approaches to overcoming these problems have resulted in the development of the trench capacitor (see for example U.S. Pat. No. 5,374,580) and the stacked capacitor (see for example U.S. Pat. No. 5,021,357). The trench capacitor has the well known problem of "gated diode leakage". Reducing the thickness of the dielectric also can improve the capacitance of the capacitor, but this approach is limited because of yield and reliability problems.

In another method, a capacitor over bit line (COB) cell with a hemispherical-grain (HSG-Si) polysilicon storage node has been developed (see "A CAPACITOR OVER BIT LINE CELL WITH HEMISPHERICAL-GRAIN STORAGE NODE FOR 64 Mb DRAMs", M. Sakao et al., Microelectronics Research Laboratories, NEC Corporation). The feature of the prior art is that a capacitor is formed by HSG-Si using "seeding method" to increase the area of the capacitor. Yet another prior capacitor cell has been disclosed in U.S. Pat. No. 5,302,540. This patent discloses a capacitor having a first conductive layer with a plurality of cylindrical sections, a dielectric layer over the first conductive layer, and a second conductive layer formed over the dielectric layer.

SUMMARY

In accordance with the present invention, a method of manufacturing a capacitor using a chemical mechanical polishing (CMP) process is provided. In one embodiment adapted for use in a DRAM cell, a substrate having a transistor, a bit line and a word line formed therein and thereon is provided. A first dielectric layer is then formed on the substrate. A second dielectric layer is subsequently formed on the first dielectric layer. A CMP process is used to planarize the second dielectric layer, thereby providing a better topography for subsequent processing (e.g., photolithography processes typically perform better on a planarized topography). Then, the first and second dielectric layers are patterned and etched to form a contact hole exposing a source/drain region of the transistor. In this embodiment, the contact hole is formed at or near the minimum dimensions supported by the photolithography process. A first conductive layer is then formed on the second dielectric layer and in the contact hole.

Next, a spin on glass (SOG) layer is formed on the first conductive layer. The SOG layer is planarized by performing a thermal treatment at a temperature of about 400° C., which reflows the SOG layer. The planarized SOG layer provides a better topography for the next step, in which a photoresist layer is formed and patterned on the SOG layer to form a mask that is aligned with the contact hole. In this embodiment, the mask is formed at or near the minimum dimensions supported by the photolithography process. The photoresist mask is then anisotropically etched. Consequently, the photoresist mask becomes narrower and thinner. Afterwards, an anisotropic etching process is performed to remove portions of the residual SOG layer, using the residual photoresist mask as an etching mask.

Next, the photoresist mask is removed, thereby forming a SOG pillar on the first conductive layer and aligned with the contact hole. This insulator pillar has a width that is less than the minimum dimension supported by the photolithography process. A thin second conductive layer is conformally formed on the surface of the insulator pillar and on the first conductive layer. A magnetic enhanced reactive ion etching (MERIE) process is used to anisotropically etch the second conductive layer to form a conductive sidewall spacer on a sidewall of the pillar. A high selectivity etching process is then performed to remove the pillar, thereby forming a bottom electrode of a capacitor from the remaining portions of the first and second conductive layers. The removed pillar leaves a sub-minimum dimension trench in the bottom electrode, which increases the surface area of the electrode. Because the trench has sub-minimum dimensions, the size of the electrode may be further decreased compared to electrodes formed in conventional processes, thereby allowing greater DRAM density while maintaining high capacitance.

A dielectric film having a high dielectric constant is then deposited along the surface of the first conductive layer and the second conductive layer. Finally, a third conductive layer is deposited on the dielectric film using a conventional LPCVD process over the dielectric film. The third conductive layer is patterned and etched to form a top storage electrode. The resulting semiconductor capacitor occupies a relatively small area of the wafer, yet has a relatively large electrode surface area. Therefore the present invention increases the capacitance of the capacitor while improving density.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

In the present invention, a new method is disclosed to fabricate a DRAM cell. The formation of the DRAM cell includes many process steps that are well known in the art. For example, the process of photolithography masking and etching is used extensively in several embodiments of the present invention. One standard photolithography process includes creating a photolithography mask containing the pattern of the component to be formed, coating the wafer with a light sensitive material known as a photoresist, exposing the photoresist coated wafer to ultraviolet light through the mask to soften or harden parts of the photoresist (depending on whether positive or negative photoresist is used), removing the softened parts of the photoresist, etching to remove the materials left unprotected by the photoresist and then stripping the remaining photoresist. This photolithography masking and etching process is referred to herein as "patterning and etching." Another well known process that is used extensively in this and many other integrated circuit fabrication processes is chemical mechanical polishing (CMP). These and other standard processes are referred to extensively herein without a detailed discussion of well known technologies.

Figure 1:
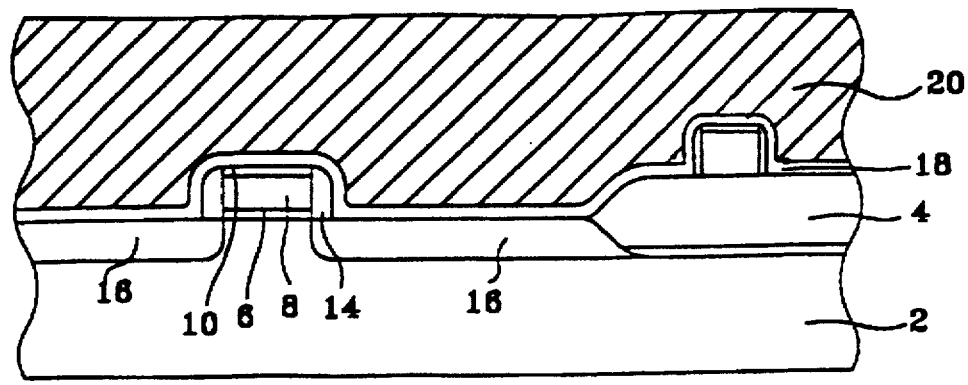
FIG. 1 is a cross-sectional view of a semiconductor wafer illustrating the step of forming a borophosphosilicate glass (BPSG) layer on a substrate, according to one embodiment of the present invention.

Referring to FIG. 1, a single crystal silicon substrate 2 with a <100> crystallographic orientation is provided. Transistors, word lines and bit lines are formed in and on the substrate 2 in any suitable manner. In one embodiment, the transistor, word lines and bit lines are formed as follows.

A thick field oxide (FOX) region 4 is formed to provide isolation between devices on the substrate 2. The FOX region 4 is created in a conventional manner. For example, the FOX region 4 can be formed via photolithography and dry etching steps to etch a silicon nitride-silicon dioxide composition layer. After the photoresist is removed and wet cleaned, thermal oxidation in an oxygen-steam environment is used to grow the FOX region 4 to a thickness of about 4000–6000 angstroms.

Next, a silicon dioxide layer 6 is created on the top surface of the substrate 2 to serve as the gate oxide for subsequently formed Metal Oxide Silicon Field Effect Transistors (MOSFETs). In this embodiment, the silicon dioxide layer 6 is formed by using an oxygen-steam ambient, at a temperature of about 850°–1000° C. Alternatively, the oxide layer 6 may be formed using any suitable oxide chemical compositions and procedures. In this embodiment, the silicon dioxide layer 6 is formed to a thickness of approximately 100 angstroms.

A first polysilicon layer 8 is then formed over the FOX region 4 and the silicon dioxide layer 6 using a Low Pressure Chemical Vapor Deposition (LPCVD) process. The first polysilicon layer 8 is doped in order to form a conductive gate for the MOSFET structure. In this embodiment, the first polysilicon layer 8 has a thickness of about 2000–3500 angstroms and is doped with $P^{31}$ or $As^{75}$ dopants at a concentration of about 1E19–1E21. A capped oxide layer 10 is formed on the first polysilicon layer 8. The capped oxide 10 is formed by using CVD to a thickness about 500–1200 angstroms. Next, standard photolithography and etching process are performed to form a gate structure and a word line. Sidewall spacers 14 are subsequently formed on the sidewalls of the first polysilicon layer. Thereafter, active regions 16 (i.e., MOSFET's source and drain) are formed by using well known processes to implant appropriate impurities in those regions and activate the impurities. In view of this disclosure, those skilled in the art of DRAM fabrication can modify this embodiment to form lightly doped drain (LDD) structures, without undue experimentation.

A first dielectric layer 18 is deposited on the gate structure and the substrate 2 for isolation. The first dielectric layer 18 in the preferred embodiment is composed of silicon nitride. A second dielectric layer 20 is subsequently formed on the first dielectric layer 18. The second dielectric layer 20 can be formed of a suitable material such as a borophosphosilicate glass (BPSG) or a tetraethylorthosilicate (TEOS) oxide. The thickness of the second dielectric layer 20 is about 3000–8000 angstroms. Then a process is used to planarize the second dielectric layer 20 to provide a better topography for patterning and etching. In other embodiments, other suitable planarizing processes may used. For example, if the second dielectric layer 20 is made of BPSG, then a reflow planarizing process may be used.

Figure 2:
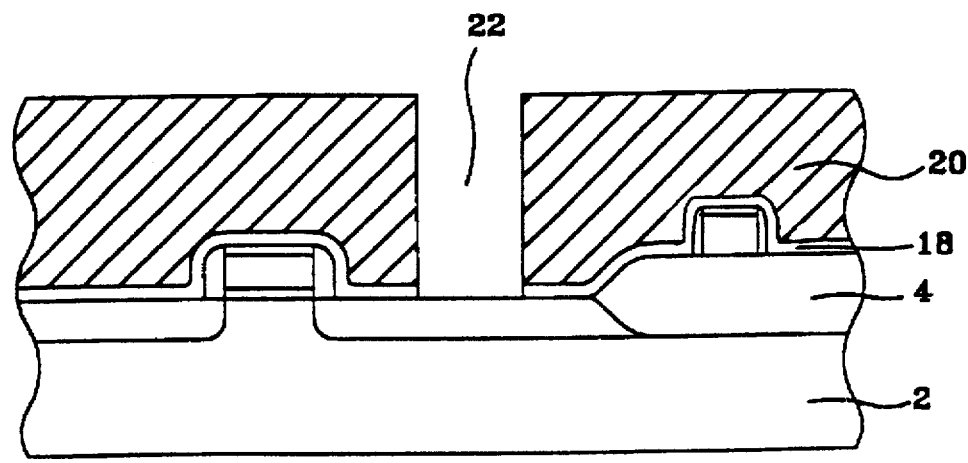
FIG. 2 is a cross-sectional view of a semiconductor wafer illustrating the step of forming a contact hole in the BPSG layer, according to one embodiment of the present invention.

Turning to FIG. 2, a patterning and etching process is performed to form a contact hole 22 in the first and second dielectric layers 18 and 20. In a preferred embodiment, the contact hole 22 is formed having the minimum dimensions supported by the photo-lithography process to increase density. The CMP process performed on the second dielectric layer 20 facilitates patterning the photoresist with the minimum dimensions.

Figure 3:
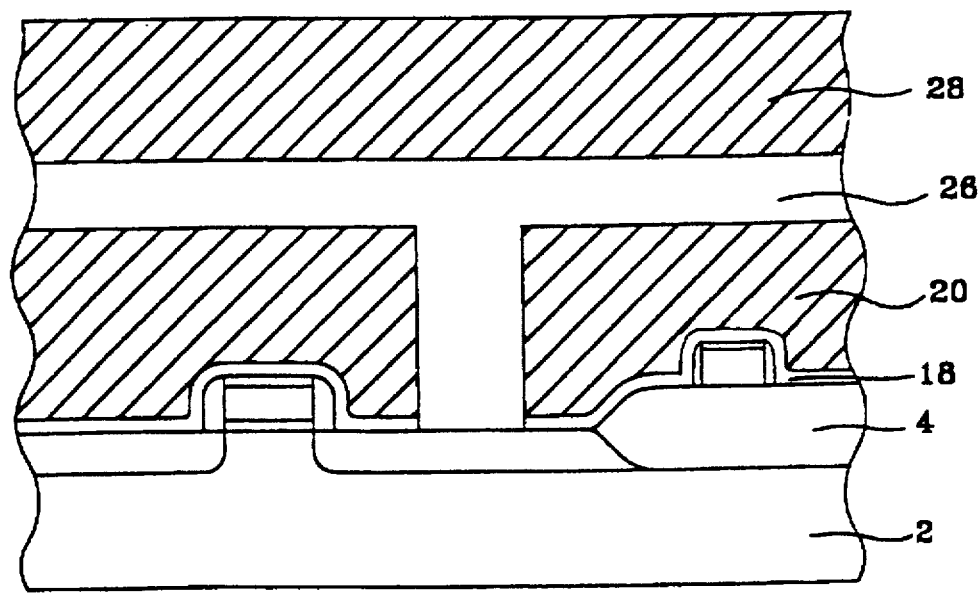
FIG. 3 is a cross-sectional view of a semiconductor wafer illustrating the step of forming a SOG layer and a first polysilicon layer, according to one embodiment of the present invention.

As shown in FIG. 3 a second polysilicon layer 26 is formed on the second dielectric layer 20 and filling the contact hole 22. The second polysilicon layer 26 is preferably formed using a conventional LPCVD process. The thickness of the second polysilicon layer 26 is preferably about 1500 angstroms, although any thickness is the range of about 1000–4000 angstroms can be used. The second polysilicon layer 26 is preferably made from doped polysilicon or in-situ doped polysilicon to increase the conductivity of the polysilicon layer 26. The doped polysilicon is preferably doped with $P^{31}$ dopants at a concentration of about 1E19–1E21 atoms/cm$^3$. Afterwards, a spin-on-glass (SOG) layer 28 is formed on the second polysilicon layer to have a thickness of about 5500 angstroms, although any thickness in the range of 3000–8000 angstroms can be used. A thermal treatment is performed to reflow the SOG layer 28 at a temperature about 400° C. The SOG layer 28 is reflowed to planarize the layer to provide a better topography for subsequent patterning and etching. Alternatively, the SOG layer 28 can be replace by another dielectric layer such as, for example, an oxide layer formed by using LPCVD.

Figure 4:
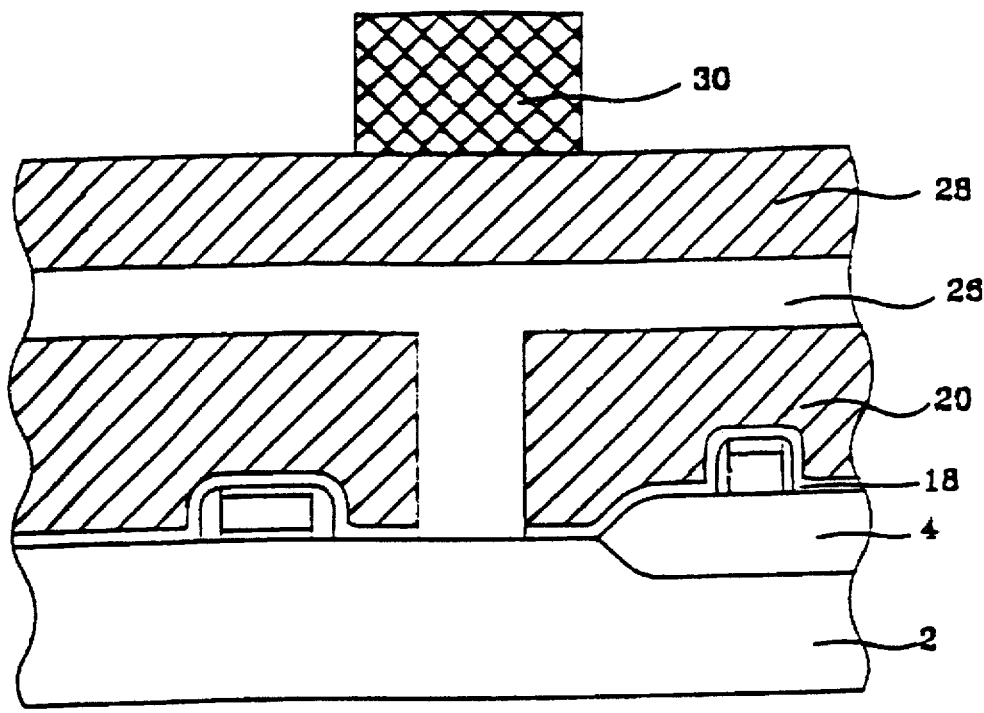
FIG. 4 is a cross-sectional view of a semiconductor wafer illustrating the step of forming a photoresist on the SOG layer, according to one embodiment of the present invention.

Referring to FIG. 4, a photoresist layer is formed and patterned on the SOG layer 28 in the usual manner to form a photoresist mask 30. Preferably, the photoresist mask 30 is aligned or centered over the polysilicon filled contact hole 22.

Figure 5:
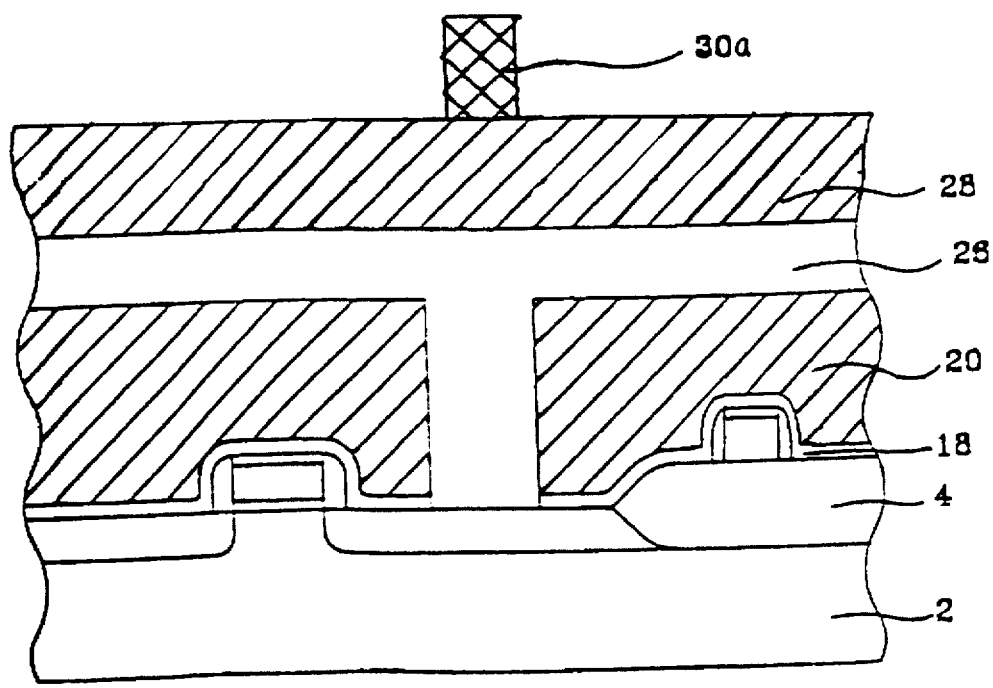
FIG. 5 is a cross-sectional view of a semiconductor wafer illustrating the step of etching the photoresist to narrow the photoresist, according to one embodiment of the present invention.

Turning to FIG. 5, an isotropic etching process is then performed. In this embodiment, the isotropic etching is performed using an oxygen plasma dry etching process. Because photoresist typically can be etched by an oxygen plasma dry etching process, the photoresist mask 30 becomes narrower and thinner, as shown in FIG. 5. Therefore, the photoresist mask 30 has dimensions that are smaller than the minimum dimensions supported by the photolithography process. For example, assume that the minimum dimension supported by the photolithography process is 0.4 micron. Assume further that the photoresist mask 30 is 0.15 micron in width after the oxygen plasma etching. Thus, by using the isotropic etching process, the photoresist mask narrower by 0.25 micron than the minimum width supported by the photolithography process.

Figure 6:
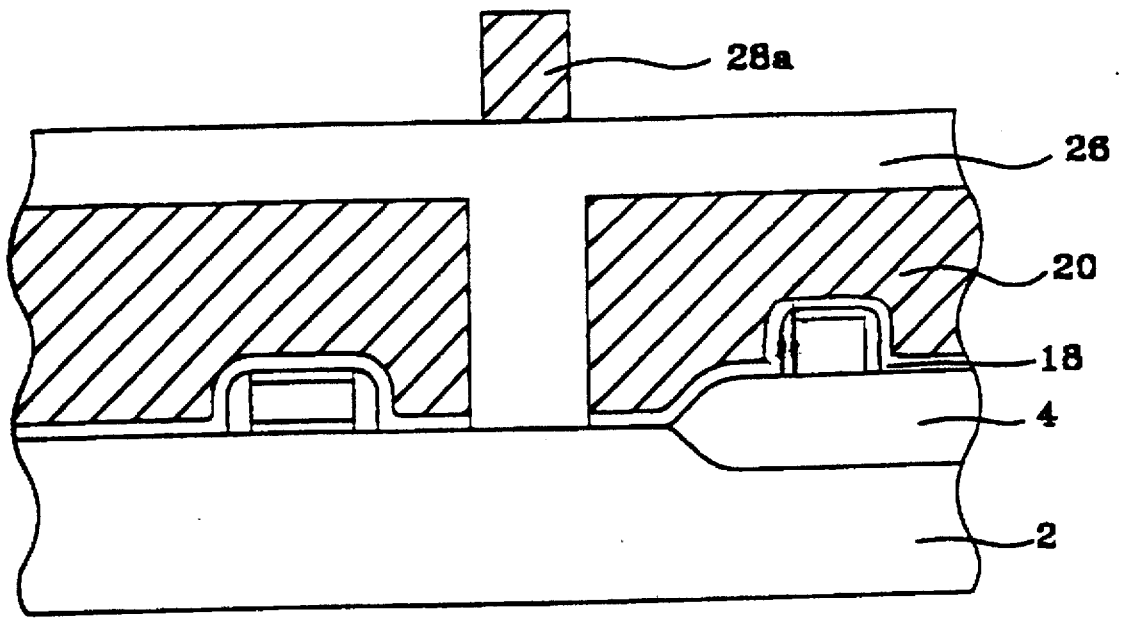
FIG. 6 is a cross-sectional view of a semiconductor wafer illustrating the step of etching the SOG layer by using the photoresist as an etching mask to form a SOG pillar, according to one embodiment of the present invention.

As shown in FIG. 6, afterward an anisotropic etching process is performed by using photoresist 30a as a mask to etch the SOG layer 28. The anisotropic etching process is used to remove the SOG layer 28 that is uncovered by the now narrowed photoresist mask 30a, thereby exposing the top surface of the second polysilicon layer 26 not covered by the photoresist mask 30. In the preferred embodiment, a magnetic enhanced reactive ion etching (MERIE) process is used to advantageously has a profile control. In this embodiment, the etchant used in the MERIE process is composed of CF$_4$, O$_2$, CHF$_3$ and Ar.

Next, the photoresist mask 30a is removed in a conventional manner, thereby leaving an insulator pillar 28a (i.e., SOG) on the surface of the second polysilicon layer 26. The insulator pillar 28a is aligned with the contact hole. Because the photoresist mask 30 had a width less then the minimum dimension of the photolithography process, the insulator pillar 28 also has a width less than the minimum dimension.

Figure 7:
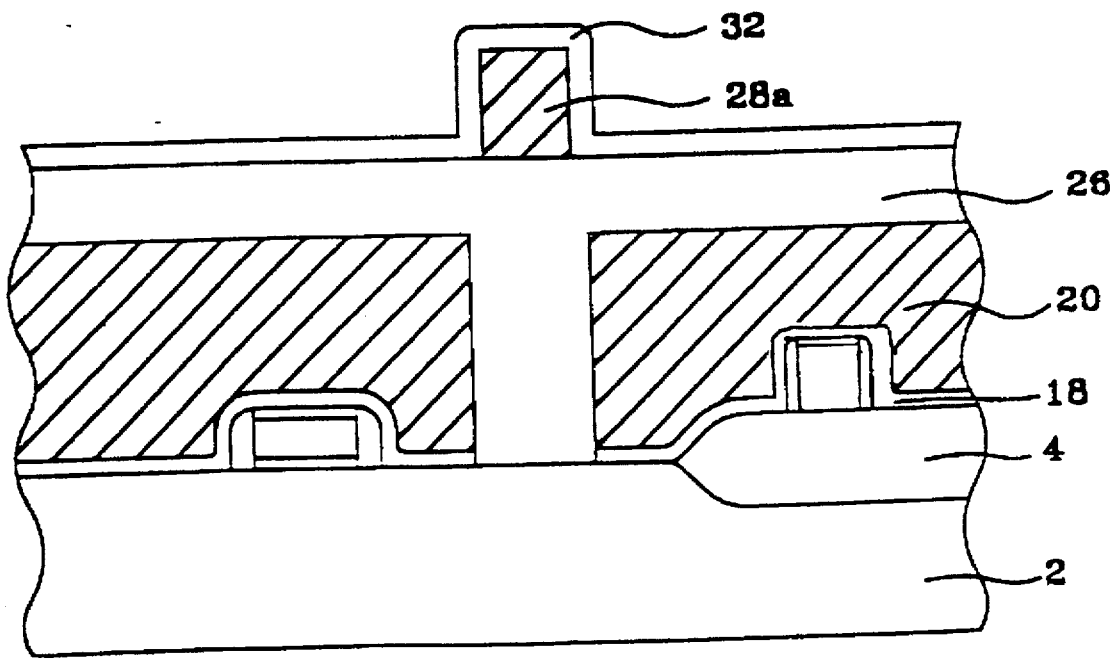
FIG. 7 is a cross-sectional view of a semiconductor wafer illustrating the step of forming a second polysilicon layer on the first polysilicon layer and the SOG pillar, according to one embodiment of the present invention.

Referring now to FIG. 7, a third polysilicon layer 32 is formed on the surface of the insulator pillar 28a and on the second polysilicon layer 26. The thickness of the third polysilicon layer 32 is preferably about 1500 angstroms, although any thickness in the range of about 500–2000 angstroms can be used. In this embodiment, the third polysilicon layer 32 is conformally formed using conventional LPCVD processing. The third polysilicon layer 32 is preferably made of in-situ doped polysilicon, doped with the same dopants and concentration as the second polysilicon layer 26.

Figure 8:
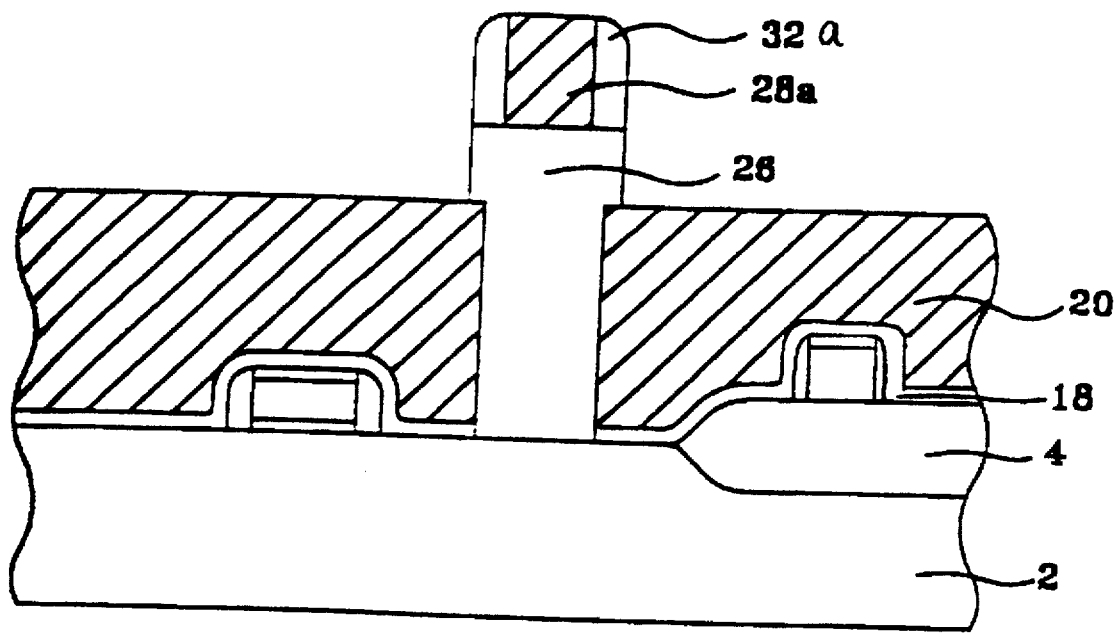
FIG. 8 is a cross-sectional view of a semiconductor wafer illustrating the step of etching the second polysilicon layer to form sidewall spacers, according to one embodiment of the present invention.

Turning to FIG. 8, the third polysilicon layer 32 is then anisotropically etched until the surface of the dielectric layer 20 near the contact hole is exposed. In this embodiment, a MERIE process is used to anisotropically etch the third polysilicon layer 32 to form sidewall spacers 32a on the sidewalls of the pillar 28a.

Figure 9:
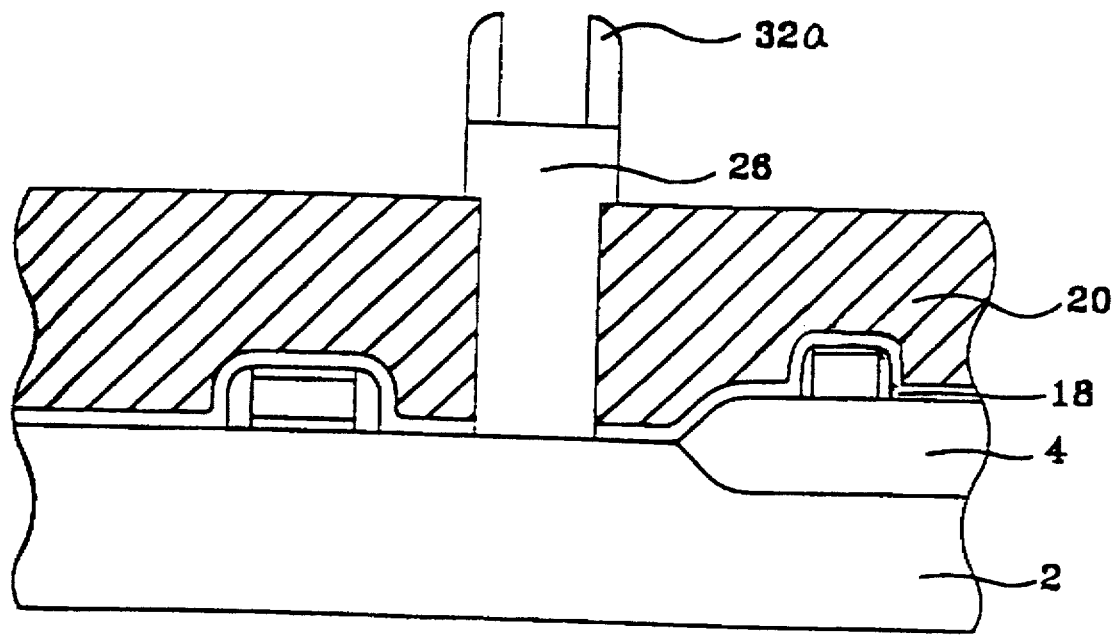
FIG. 9 is a cross-sectional view of a semiconductor wafer illustrating the step of removing the SOG pillar, according to one embodiment of the present invention.

As shown in FIG. 9, the insulator pillar 28a is then removed. A etching process having a high selectivity between insulator material and polysilicon (e.g., with a relative susceptibility of about 100-to-1) is used to removed the insulator pillar 28a. In this embodiment, an etching process using HF vapor is used to remove the pillar 28a, while leaving the polysilicon sidewall spacers 32a intact. The polysilicon structure formed by the sidewall spacers 32a and the polysilicon layer 26 serves as the bottom electrode of a DRAM cell capacitor.

The polysilicon spacers 32a increase the surface area of the bottom electrode, thereby increasing the capacitance and improving the DRAM cell's performance. Further, because a sub-minimum width structure, i.e., the insulator pillar 28a (FIG. 8), was used to form the sidewall spacers 32a, the resulting bottom electrode occupies a relatively small area of the DRAM cell. Accordingly, the density of the DRAM can be increased.

Figure 10:
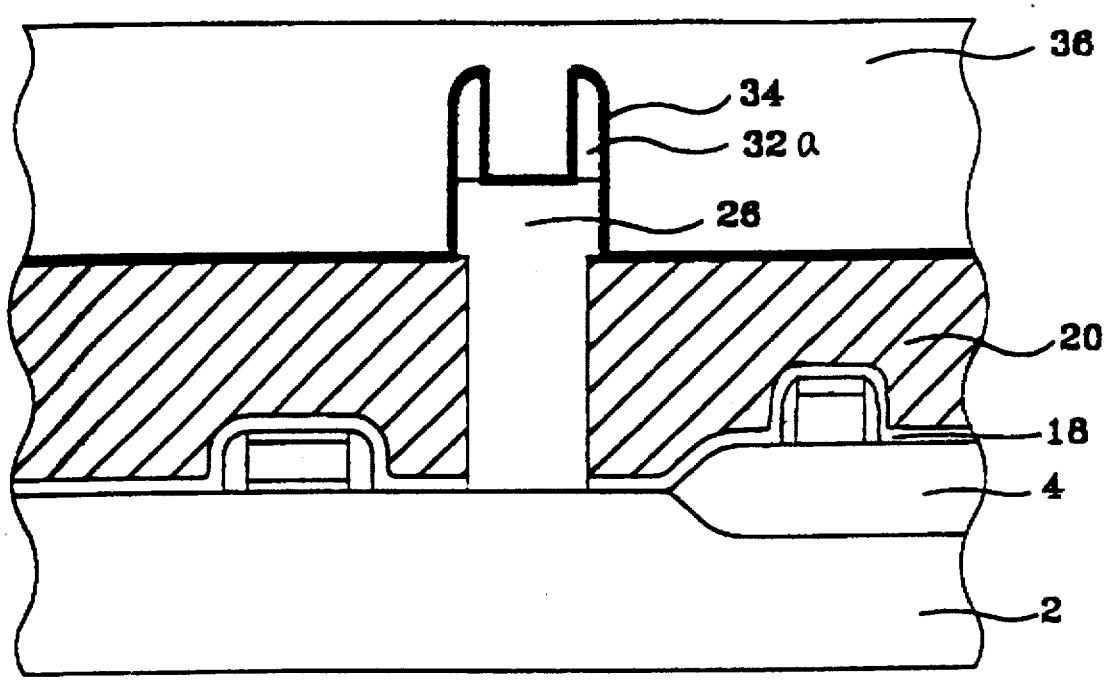
FIG. 10 is a cross-sectional view of a semiconductor wafer illustrating the step of forming a dielectric film and a third polysilicon layer, according to one embodiment of the present invention.

Turning now to FIG. 10, a dielectric film 34 is conformally deposited on the exposed surfaces of the sidewall spacers 32a and the second polysilicon layer 26 to serve as the dielectric for the DRAM cell capacitor. The dielectric film 34 can be formed of a of a nitride/oxide double film, a oxide/nitride/oxide triple film, or any other high dielectric film such as tantalum oxide (Ta$_2$O$_5$). Afterwards, a fourth polysilicon layer 36 is deposited on the dielectric film 34 using a conventional LPCVD process. The fourth polysilicon layer 36 is preferably doped in a similar manner as the second polysilicon layer 26, and serves as a top storage electrode for the DRAM cell capacitor. More specifically, the fourth polysilicon layer 36 is formed of doped or in-situ doped polysilicon. Thus, in accordance with the present invention, a semiconductor capacitor is formed that provides a relatively large surface area while occupying a relatively small area of the substrate.

In an alternative embodiment, the second dielectric layer 20 can be removed before forming the dielectric film 34. In this alternative embodiment, an etching process using HF solution can be used when the dielectric layer 20 is composed of oxide. The HF solution selectively removes the oxide while leaving the polysilicon bottom electrode intact. The nitride layer 18 serves as an etching stopper or etchstop in the HF etching process.

As will be understood by persons skilled in the art, the foregoing embodiments, including the preferred embodiment, of the present invention are illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

The embodiments of the invention in which an exclusive property or privilege is claimed are defined as follows:

1. A method of forming a capacitor on a semiconductor substrate, said method comprising:

forming a first dielectric layer on said semiconductor substrate;

forming a contact hole in said first dielectric layer to said substrate;

forming a first conductive layer on said first dielectric layer and in said contact hole;

forming a second dielectric layer on said first conductive layer;

forming and patterning a photoresist on said second dielectric layer;

isotropically etching said photoresist, thereby forming a narrowed photoresist;

anisotropically etching said second dielectric layer using said narrowed photoresist as an etching mask, thereby forming an insulator pillar on said first conductive layer and beneath said narrowed photoresist mask;

removing said narrowed photoresist;

forming a second conductive layer on said first conductive layer and said insulator pillar;

anisotropically etching said first conductive layer and said second conductive layer to form a sidewall spacer on a sidewall of said insulator pillar;

removing said insulator pillar, wherein a bottom storage node of said capacitor is formed;

forming a dielectric film on exposed surfaces of said first conductive layer and said sidewall spacer; and forming a third conductive layer over said dielectric film, said third conductive layer serving as a top storage node of said capacitor.

2. The method of claim 1, wherein said forming a second conductive layer comprises forming a conformal doped polysilicon layer on said first conductive layer and said insulator pillar.

3. The method of claim 1 further including performing a chemical mechanical polishing (CMP) process on said first dielectric layer after said first dielectric layer is formed.

4. The method of claim 1 wherein said first dielectric layer comprises borophosphosilicate glass (BPSG).

5. The method of claim 1 wherein said first dielectric layer comprises tetraethylorthosilicate (TEOS) oxide.

6. The method of claim 1, wherein said first dielectric layer is formed to have a thickness of approximately 3000–8000 angstroms.

7. The method of claim 1, wherein said first conductive layer is formed to have a thickness in a range of about 1000–4000 angstroms.

8. The method of claim 7, wherein said first polysilicon layer comprises doped polysilicon.

9. The method of claim 8, wherein said first doped polysilicon comprises in-situ doped polysilicon.

10. The method of claim 1, wherein said second dielectric layer comprises spin-on glass (SOG).

11. The method of claim 10, wherein said second dielectric layer is formed to have a thickness of approximately 5500 angstroms.

12. The method of claim 1, further comprising forming a nitride layer on said substrate beneath said first dielectric layer.

13. The method of claim 1, wherein said isotropically etching said photoresist and said second dielectric layer comprises isotropically etching using an oxygen plasma etching process.

14. The method of claim 1, wherein said anisotropically etching said second dielectric layer comprises anisotropically etching using a magnetic enhanced reactive ion etching (MERIE) process.

15. The method of claim 14, wherein said MERIE process comprises using an etchant comprising $CF_4$, $O_2$, $CHF_3$, and Ar.

16. The method of claim 1, wherein said removing said insulator pillar comprises etching said insulator pillar using an etchant comprising HF.

17. The method of claim 1, wherein said dielectric film comprises tantalum oxide ($Ta_2O_5$).

18. The method of claim 1, wherein said dielectric film comprises a oxide/nitride/oxide triple film.

19. The method of claim 1, wherein said dielectric film comprises a nitride/oxide double film.

20. The method of claim 1, wherein said second conductive layer comprises doped polysilicon.

21. The method of claim 20, wherein said second polysilicon layer comprises in-situ doped polysilicon having a thickness of about 500–2000 angstroms.

22. The method of claim 1, wherein said third conductive layer comprises doped polysilicon, in-situ doped polysilicon.

23. The method of claim 22, wherein said third polysilicon layer comprises in-situ doped polysilicon having a thickness of about 1500 angstroms.

24. The method of claim 1, wherein said method, before forming said first dielectric layer, further comprises:

forming a field oxide (FOX) region on said substrate;

forming a silicon dioxide layer on a top surface of said substrate, wherein said silicon dioxide layer serves as a gate oxide for a transistor;

forming a fourth polysilicon layer on said FOX region and said silicon dioxide layer;

forming a silicide layer on said fourth polysilicon layer;

patterning and etching said fourth polysilicon layer to form a gate structure for said transistor and to form a word line for a memory device incorporating said transistor;

forming source and drain regions in said substrate for said transistor;

forming a third dielectric layer on said gate structure and said source and drain regions;

forming a contact window in said third dielectric layer;

forming a metal layer on said third dielectric layer and said contact window;

patterning and etching said metal layer to form a bit line for said memory device; and forming a nitride layer on said third dielectric layer and said bit line.

25. A method of forming a polysilicon structure on a semiconductor substrate, said method comprising:

forming a borophosphosilicate glass (BPSG) layer on said semiconductor substrate;

forming a contact hole in said BPSG layer to said substrate;

forming a first polysilicon layer on said BPSG layer and in said contact hole;

forming a spin-on-glass.(SOG) layer on said first polysilicon layer;

forming and patterning a photoresist layer on said SOG layer, wherein a photoresist mask is formed, said photoresist mask having a width of about the minimum width supported by said patterning;

eroding said photoresist mask and said SOG layer by isotropically etching said photoresist mask, wherein a narrowed photoresist mask is formed;

anisotropically etching said SOG layer using said narrowed photoresist mask as an etching mask, wherein a SOG pillar is formed on said first polysilicon layer;

removing said narrowed photoresist mask;

conformally forming a second polysilicon layer on said first polysilicon layer and said SOG pillar;

anisotropically etching said first polysilicon layer and said second polysilicon layer to formed a sidewall spacer on a sidewall of said SOG pillar; and removing said SOG pillar.

26. The method of claim 25, wherein said eroding said photoresist mask comprises isotropically etching said photoresist mask using an oxygen plasma etching process.

27. The method of claim 25, wherein said anisotropically etching said SOG layer comprises a MERIE process.

28. The method of claim 25, wherein said removing said SOG pillar comprises etching said SOG pillar using an etchant comprising HF.

* * * * *